(12) United States Patent
Jadrić et al.

(10) Patent No.: US 6,404,346 B1
(45) Date of Patent: Jun. 11, 2002

(54) METHOD AND APPARATUS FOR DETECTING A FAILED THYRISTOR

(75) Inventors: Ivan Jadrić; Harold R. Schnetzka, both of York, PA (US)

(73) Assignee: York International Corporation, York, PA (US)

(*) Notice: Subject to any disclaimer, the term of this patent is extended or adjusted under 35 U.S.C. 154(b) by 0 days.

(21) Appl. No.: 09/373,501

(22) Filed: Aug. 13, 1999

(51) Int. Cl.⁷ .............................................. G08B 21/00
(52) U.S. Cl. ...................... 340/635; 340/660; 340/664; 361/79; 361/100; 361/117
(58) Field of Search ................................ 340/635, 660, 340/662, 663, 664, 638; 318/800, 729; 361/56, 91.8, 93.7, 117, 119, 91, 93.1, 100, 78, 79, 86, 87; 323/224, 205

(56) References Cited

U.S. PATENT DOCUMENTS

| | | | | |
|---|---|---|---|---|
| 3,987,314 A | 10/1976 | Leowald et al. | ............ | 327/475 |
| 4,057,842 A | 11/1977 | Bauman et al. | ............... | 318/99 |
| 4,074,346 A | 2/1978 | Riley | ............ | 363/50 |
| 4,237,531 A | 12/1980 | Cutler et al. | .................. | 363/58 |
| 4,238,821 A | 12/1980 | Walker | ............ | 363/58 |
| 4,370,609 A | * 1/1983 | Wilson et al. | .............. | 324/522 |
| 4,393,442 A | 7/1983 | Kähkipuro | .................... | 363/63 |
| 4,424,544 A | 1/1984 | Chang et al. | ................. | 361/56 |
| 4,475,150 A | 10/1984 | D'Atre et al. | .................. | 363/51 |
| 4,554,463 A | 11/1985 | Norbeck et al. | ............ | 347/143 |
| 4,590,416 A | * 5/1986 | Porche et al. | ................. | 323/205 |
| 4,672,303 A | 6/1987 | Newton | ................. | 323/285 |
| 4,682,278 A | 7/1987 | Marquardt et al. | ........... | 363/58 |
| 4,710,692 A | 12/1987 | Libert et al. | ................ | 318/729 |
| 4,742,535 A | 5/1988 | Hino et al. | ................. | 378/105 |
| 4,833,628 A | 5/1989 | Curran, Jr. | ................. | 318/800 |
| 4,912,390 A | 3/1990 | Curran, Jr. et al. | ......... | 318/812 |
| 4,928,219 A | 5/1990 | Roslund et al. | ............. | 363/54 |
| 4,959,764 A | 9/1990 | Bassett | ........................ | 363/16 |
| 4,982,145 A | 1/1991 | Peterson | ..................... | 363/16 |
| 5,057,987 A | 10/1991 | Kumar et al. | ............... | 318/594 |
| 5,115,387 A | 5/1992 | Miller | ........................ | 363/58 |
| 5,127,085 A | 6/1992 | Becker et al. | .............. | 318/434 |
| 5,151,642 A | 9/1992 | Lombardi et al. | ........... | 318/779 |
| 5,155,650 A | * 10/1992 | Pitsch et al. | ................. | 361/119 |
| 5,182,464 A | * 1/1993 | Woodworth et al. | ........... | 307/87 |
| 5,235,504 A | * 8/1993 | Sood | ............................ | 363/53 |
| 5,262,691 A | 11/1993 | Bailey et al. | ............... | 327/440 |
| 5,293,111 A | 3/1994 | Weinberg | ................... | 323/222 |

(List continued on next page.)

FOREIGN PATENT DOCUMENTS

JP          07245938          9/1995

OTHER PUBLICATIONS

A. P. Connolly et al., "DC Gate Triggering Specifications," *SCR Manual Sixth Edition*, pp. 85–86.
J. G. Kassakian et al., "Chapter 6 High–Frequency Switching dc/dc Converters," *Principles of Power Electronics*, pp. 110–116.
R. L. Boylestad, Introductory Circuit Analysis, 4th Edition, pp. 626–629.
S.V. Soanes, "How to Measure SCR Currents," *Electrical Design News* vol. 16, No. 17, Sep., 1971 p. 40.

Primary Examiner—Edward Lefkowitz
Assistant Examiner—Davetta W. Goins
(74) Attorney, Agent, or Firm—Finnegan, Henderson, Farabow, Garrett & Dunner, L.L.P.

(57) ABSTRACT

A method or system consistent with this invention for detecting if a thyristor failed open in an alternating current input phase of a load comprises measuring an instantaneous power delivered to the load during a cycle of the input; determining a peak power delivered to the load during the cycle of the input; calculating an average power delivered to the load during the cycle of the input; and determining if the thyristor failed open by comparing the magnitudes of the peak power and the average power.

21 Claims, 4 Drawing Sheets

U.S. PATENT DOCUMENTS

| | | | |
|---|---|---|---|
| 5,365,394 A | 11/1994 | Gomez Ibarguengoitia | 361/33 |
| 5,365,419 A | 11/1994 | Schreiber | 363/16 |
| 5,369,543 A * | 11/1994 | Bonnesen et al. | 361/117 |
| 5,375,028 A | 12/1994 | Fukunaga | 361/93.7 |
| 5,376,830 A | 12/1994 | Ashley et al. | 361/33 |
| 5,414,341 A | 5/1995 | Brown | 363/16 |
| 5,606,482 A | 2/1997 | Witmer | 361/93.7 |
| 5,617,016 A | 4/1997 | Borghi et al. | 327/134 |
| 5,684,377 A | 11/1997 | Kim et al. | 361/93.5 |
| 5,734,562 A | 3/1998 | Redl | 323/268 |
| 5,745,352 A | 4/1998 | Sandri et al. | 363/16 |
| 5,757,599 A | 5/1998 | Crane | 361/56 |
| 5,796,259 A | 8/1998 | Dickmander | 324/524 |
| 5,831,807 A | 11/1998 | Masannek et al. | 361/93.2 |

* cited by examiner

METHOD AND APPARATUS FOR DETECTING A FAILED THYRISTOR

BACKGROUND OF THE INVENTION

1. Field of the Invention

The present invention relates to detecting a failed thyristor, and more particularly to detecting a failed open thyristor in reduced voltage solid-state motor starters.

2. Description of the Related Art

Electric motors often use "thyristors," which are also known as "silicon controlled rectifiers" ("SCRs"), as part of the motors' control circuitry. A thyristor can be thought of as a switchable diode with three terminals: a gate, an anode, and a cathode. If a supply voltage that is less than a breakdown voltage is applied across the anode and cathode of the thyristor, and no "trigger" current or voltage (trigger signal) is applied to the gate, the thyristor is "off," i.e., no current flows from the anode to the cathode. If a trigger signal is applied to the gate, the voltage across the anode and cathode of the thyristor drops to a very low value in comparison to the supply voltage, and the thyristor turns "on," i.e. current flows through the thyristor from the anode to the cathode. Once on, the thyristor can remain on, provided the current through the thyristor remains above a holding current, regardless of the trigger signal at the gate. For the thyristor to turn off, the anode to cathode current must be reduced to a level below the holding current value for the device.

As is well known in the art, solid state starters, or controllers, control electric current flow from a power supply to the motor while the motor is starting. These starters have thyristor switches that gradually increase the current delivered to the motor. Using the thyristor switches, the starter regulates the time period that the thyristors conduct electricity and pass current. In other words, the starter controls when the current from the power supply is delivered to the motor. By controlling the current supplied to the motor during startup, the motor is gently brought up to full operating speed.

When an electric motor is started without such a starter, current drawn by the motor can be excessive, typically six times the steady state current, i.e., the current once it reaches full operating speed. This large current inrush can cause a voltage drop in the power distribution system, causing lights to dim and flicker and disturbing nearby equipment. In addition, the motor torque may rise quickly and oscillate, which can adversely affect the mechanical components of the motor or anything coupled to it.

Failure of a thyristor in the starter may also result in poor motor functioning. Thyristor failures generally result in unbalanced power supply conditions, which may lead to large torque oscillations that can damage mechanical couplings and gears driven by the motor. Some present day thyristor failure detectors use an electronic circuit intended to detect an open thyristor fault, i.e., when the thyristor fails to conduct when it is intended. These thyristor failure detectors indirectly measure three currents through three supply lines by measuring three voltages generated by current transformers in the supply lines. The three voltages are rectified and summed. This summed signal ideally falls within a certain range, which characterizes the correct operation of the system. If the summed signal falls out of this predetermined range, and such a situation persists for a predetermined period of time, the detector signals a fault. This detector circuit assumes that, in the case of a thyristor failure, the motor current waveform is distorted in a way that causes an excessive ripple in the summed signal. This assumption, however, has two problems which may cause malfunctioning in the detector.

First, the motor current waveform may be distorted for other reasons than a faulty thyristor. For example, the motor may operate in magnetic saturation. In such a case, the ripple affecting the summed signal may cause the fault detector to falsely detect a failure condition. Second, if a thyristor fails open, the distorted summed signal may last for a time period that is much shorter than the predetermined time, and the failure goes undetected. Shortening the predetermined time would only increase the sensitivity of the detection circuit and may result in false detections.

Therefore, there is a need to detect quickly a failed-open thyristor during operation of the motor without creating false detections.

SUMMARY OF THE INVENTION

A method consistent with this invention detects if a thyristor failed open in a solid-state controller, or starter, for delivering power to a load by an input. The method comprises measuring an instantaneous power delivered to the load during a cycle of the input, determining a peak power delivered to the load over the cycle of the input, calculating an average power delivered to the load over the cycle of the input, and determining if the thyristor failed open by comparing the magnitudes of the peak power and the average power.

An apparatus consistent with this invention detects if a thyristor failed open in a solid-state controller for delivering power to a load by an input. The apparatus comprises a power meter for measuring an instantaneous power delivered to the load during a cycle of the input; a memory containing a program configured to determine a peak power delivered to the load over the cycle of the input, calculate an average power delivered to the load over the cycle of the input, and determine if the thyristor failed open by comparing the magnitudes of the peak power and the average power; and a processor for running the program.

The summary and the following detailed description should not restrict the scope of the claimed invention. Both provide examples and explanations to enable others to practice the invention. The accompanying drawings, which form part of the detailed description, show one embodiment of the invention and, together with the description, explain the principles of the invention.

BRIEF DESCRIPTION OF THE DRAWINGS

The accompanying drawings, which are incorporated in and constitute a part of this specification, illustrate embodiments of the invention and together with the description, serve to explain the principles of the invention. In the drawings.

The following description of embodiments of this invention refer to the accompanying drawings.

DESCRIPTION OF THE PREFERRED EMBODIMENT

Figure 1:
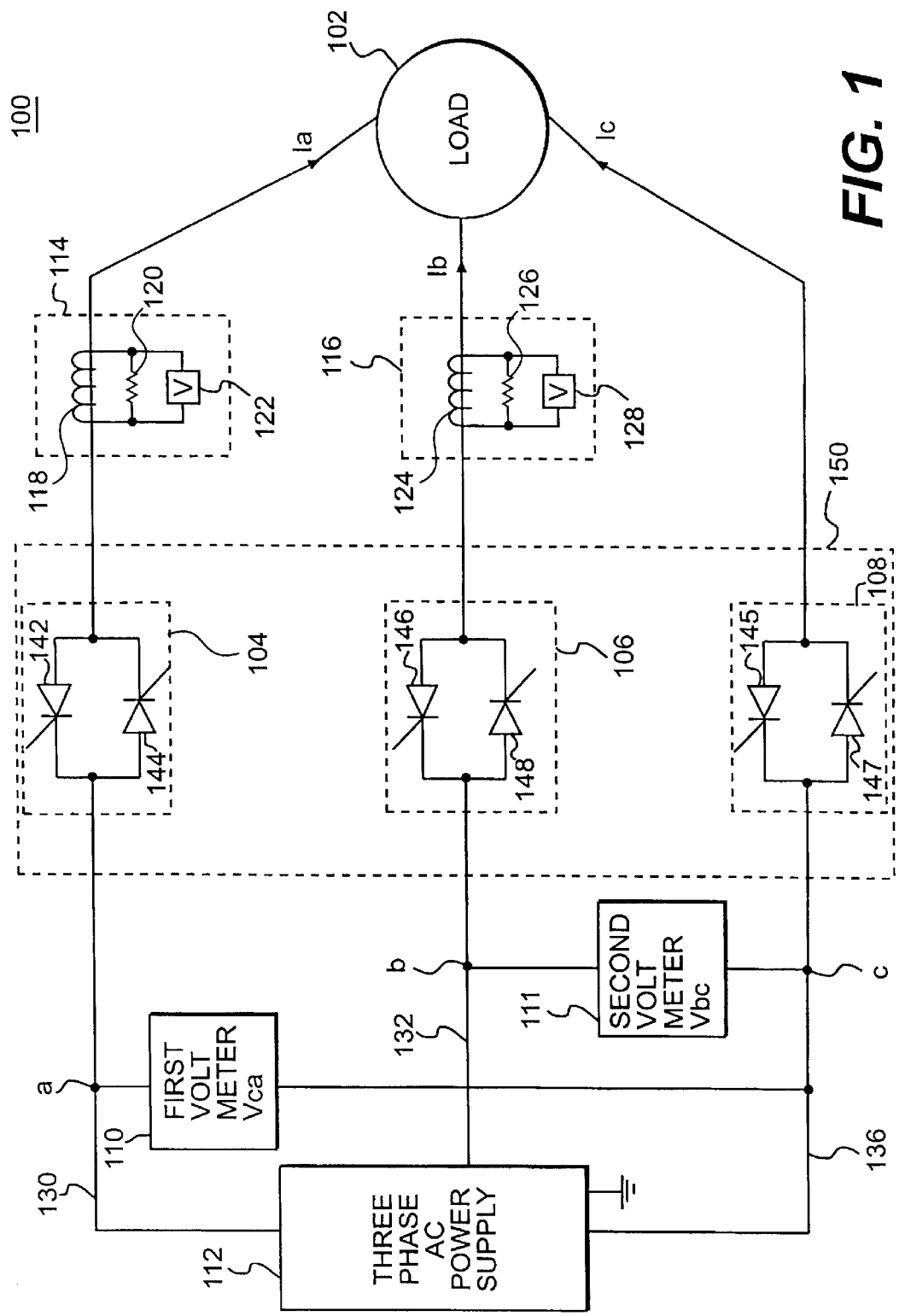
FIG. 1 is a schematic diagram, consistent with this invention, of a circuit consisting of a three phase alternating current power supply for a load with a solid-state starter or controller.

FIG. 1 is a schematic diagram, consistent with this invention, of a three phase alternating current power supply 112 for load 102 with a reduced voltage solid state controller 150. As mentioned above, starter 150 reduces the current supplied to load 102 in a well-known manner during start up. Load 102 may comprise a three-phase motor, which may drive various components of a refrigeration system. The refrigeration system may include a compressor, a condenser, a heat-exchanger, and an evaporator.

Three phase alternating current power supply 112 supplies load 102 via a first power supply line 130, a second power supply line 132, and a third power supply line 136. Each line carries alternating current, but each has a different phase angle. Line 130 has a first thyristor pair 104, comprising a first thyristor 142 and a second thyristor 144. Thyristors 142 and 144 are connected "back-to-back," i.e., the anode of thyristor 142 is connected to the cathode of thyristor 144, and vice versa. Similar to line 130, line 132 has a second back-to-back thyristor pair 106, and line 136 has a third back-to-back thyristor pair 108. Control circuitry for timing and triggering thyristor pairs 104, 106, and 108, is well-known and is not shown.

Figure 2:
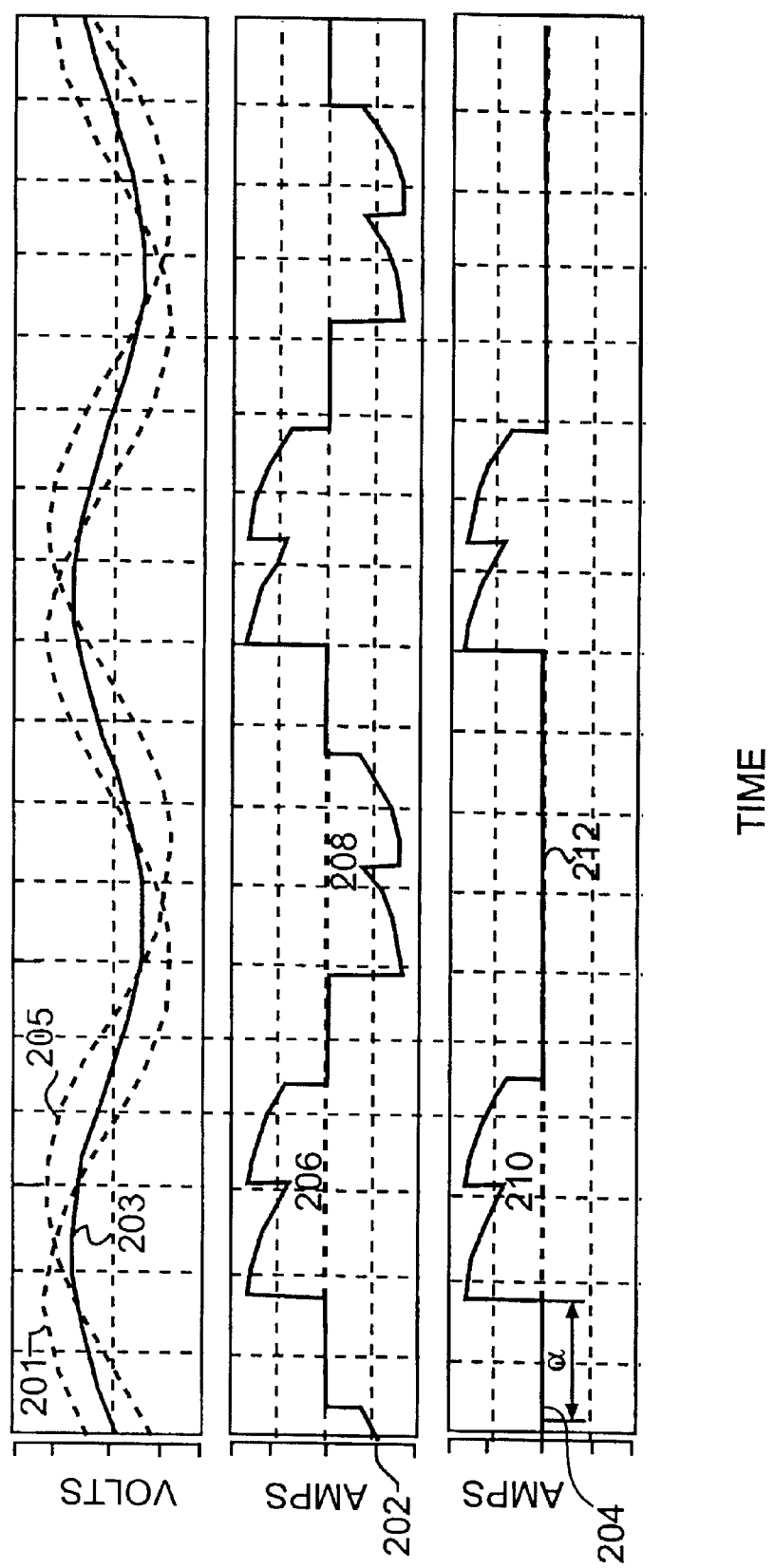
FIG. 2 is a diagram of curves representing a current in a supply line and voltages between supply lines of three-phase AC power supply 112 of FIG. 1.

Three phase power supply 112 outputs sinusoidal voltages on lines 130, 132, and 136 that have positive half cycles and negative half cycles, each at a different phase angle. FIG. 2 is a diagram of curves representing voltages between lines 130, 132, and 136 of three phase power supply 112 in FIG. 1. Curve 201 represents a line-to-line voltage Vab between line 130 and 132. Curve 205 represents a line-to-line voltage Vac between line 130 and line 136. Curve 203 represents a line-to-neutral voltage Van between line 130 and ground. The voltage on line 130 at point a leads the voltage on line 132 at point b by 120°, which leads the voltage on line 136 at point c by 120° (a-b-c rotation). When voltage Vab is in a positive half cycle, thyristor 144 may be triggered as early as 30 degrees later (a-b-c rotation), and up to a full positive half cycle of current may pass through line 130 as a current Ia. When voltage Vab is in a negative half cycle, thyristor 142 may be triggered as early as 30 degrees later (a-b-c rotation), and up to a full negative half cycle of current may pass through line 130 as current Ia. This well-known process applies similarly for thyristor pair 106 and 108.

If load 102 were a motor accelerating during startup, however, thyristors 142 and 144 are triggered in a delayed manner to control the current delivered to motor 102. Referring again to FIG. 2, curves 202 and 204 represent current Ia through line 130 while thyristor pair 104 is triggered in a delayed manner when load 102 is resistive. A resistive load is chosen to simplify curves 202 and 204 for illustration purposes. Although a three phase motor is not resistive, the operation of the invention when load 102 is a motor is similar. Curve 202 represents normal operation, and curve 204 represents operation when thyristor 142 fails to conduct.

Regarding curve 202, when voltage Vab is in a positive half cycle and thyristor 144 is triggered at an angle α, then thyristor 144 conducts and current Ia increases and follows voltage Vab for the first half of its positive conduction period, and follows Vac for the second half of its positive conducting period, as shown by area 206. When voltage Vab is in a negative half cycle and thyristor 142 is triggered at an angle α, then thyristor 142 conducts and current Ia decreases and follows voltage Vab for the first half of its negative conduction period, and follows Vac for the second half of its negative conduction period. The cycle then repeats itself. As seen from curve 202, the DC component of current Ia is zero during normal operation. This analysis is well-known and applies similarly for thyristor pairs 106 and 108.

Likewise, for curve 204, when Vab is in a positive half cycle and thyristor 144 is triggered at angle a, then thyristor 144 conducts and current Ia increases and follows voltage Vab for the first half of its positive conduction period, and follows voltage Vac for the second half of its positive conducting period, as shown by area 210. When voltage Vab is in a negative half cycle and thyristor 142 is not triggered during angle a, or fails to conduct, then current Ia remains zero during the negative half cycle of Van, as shown by portion 212 of curve 204. As seen from curve 204, the DC component of current Ia is non-zero when a thyristor fails to conduct. Again, this well-known analysis applies similarly for thyristor pair 106 and 108.

In methods and systems consistent with this invention, a first voltmeter 110 detects an instantaneous voltage Vca between third line 136 and first line 130, and a second voltmeter 111 detects an instantaneous voltage Vbc between second line 132 and third line 136. In methods and systems consistent with this invention, a first magnetically coupled ammeter 114 detects an instantaneous current Ia in first line 130, and a second magnetically coupled ammeter 116 detects an instantaneous current Ib in second line 132.

First ammeter 114 comprises a current transformer 118, a resistor 120, and a voltmeter 122. It is inconvenient to break first line 130 to measure current Ia, so first ammeter 114 detects current Ia by magnetic induction. Alternating current Ia through line 130 creates a time-varying magnetic field that induces a current in current transformer 118 that flows through resistor 120. Voltmeter 122 measures voltage across resistor 120, which determines the current through resistor 120, and hence current Ia through first line 130. The same applies to second ammeter 116 comprising a current transformer 124, a resistor 126, and a voltmeter 128. It is noted that ammeters 114 and 116 cannot detect direct current through first line 130 or second line 132. This is because direct current creates static magnetic fields, which cannot induce current in a stationary coil, such as current transformer 118 or current transformer 124.

If any thyristor 142–148 of thyristor pairs 104, 106, or 108 in any line 130, 132, or 136 fails open, i.e., fails to conduct, then the line with the failure carries only unidirectional current with an AC and a non-zero DC component. Further, if any thyristor 142–148 fails open, all three of line currents Ia, Ib, and Ic have an AC and a non-zero DC component. As mentioned above, ammeters 114 and 116 cannot detect the DC components of the current in the steady state, but they can detect the DC component for 30 to 130 microseconds during the transition after the failure event. This transition time period is determined by the current transformer design and the value of the transformer resistor. Thus, 30 to 130 microseconds after a failed open condition, ammeters 114 and 116 detect only the AC component of the current, whose value is almost unaffected by the fault.

Thyristor Failure During Motor Steady State Speed

If load 102 is a motor and if any thyristor 142–148 fails open while the motor is running at, or around, its rated speed, the motor continues to run, but the motor's torque contains large oscillations superimposed on a positive average value. As explained above, these oscillations may lead to a mechanical or electrical failure of the system. The oscillations are a result of all three currents Ia, Ib, and Ic having a non-zero DC and an AC component. The DC component in current Ia indicates this fault, but because ammeters 114, 116 are magnetically coupled, it is difficult to detect the DC component.

Methods and systems consistent with this invention measure first instantaneous line current Ia, second instantaneous line current Ib, first instantaneous line voltages Vca, and second instantaneous line voltage Vbc. Currents Ia, Ib and voltages Vca, Vbc are measured, or sampled, by ammeters 114, 116 and by voltmeters 110, 111, respectively, every 160 microseconds, or approximately 100 times per cycle. Methods and systems consistent with this invention then calculate an instantaneous power P as P=Ia Vca+Ib Vbc. Measuring the power delivered to load 102 in this fashion is commonly called the "two-wattmeter" method.

While the motor operates in steady state without a thyristor fault, P is a constant. After any thyristor 142–148 fails open, P remains positive, but changes value and has a ripple. Thus, a thyristor failure changes the power signal as measured with the two wattmeter method.

Methods and systems consistent with this invention then calculate a peak power $P_{peak}$ and an average power $P_{avg}$ during each cycle. A cycle is determined by the positive sloped zero crossings of voltage Vab as calculated from measurements taken by voltmeter 110 and voltmeter 111. Then, methods and systems consistent with this invention calculate a power ratio that equals $(P_{peak}-P_{avg})/P_{avg}$.

Table I shows peak power $P_{peak}$, average power $P_{avg}$, the difference between peak power $P_{peak}$ and average power $P_{avg}$, and the power ratio during full speed motor operation with a failed thyristor. The data were obtained by simulating a 790 Hp motor, with one thyristor of thyristors 142–148 failed opened at full motor speed with different loads.

TABLE I

Thyristor Failure During Full Motor Speed

| Load | $P_{peak}$ (kW) | $P_{avg}$ (kW) | $P_{peak}-P_{avg}$ (kW) | $(P_{peak}-P_{avg})/P_{avg}$ (%) |
|---|---|---|---|---|
| No load | 30.00 | 14.00 | 16.00 | 114.29 |
| Half load | 373.00 | 320.00 | 53.00 | 16.56 |
| Full load | 724.00 | 633.00 | 91.00 | 14.38 |

From Table I, the power ratio ranges from 14.38% to 114.29% with the failed open thyristor. On the other hand, when the motor is running at full speed at any load without a failed open thyristor, the power ratio is near zero and always significantly less than 10%. Thus, methods and systems consistent with this invention detect a failed open thyristor when the power ratio exceeds a first predetermined threshold. In this simulation, a failed open thyristor is identified when value of the power ratio $(P_{peak}-P_{avg})/P_{avg}$ exceeds 10%, for example.

Thyristor Failure Prior to Attempting Motor Startup

If load 102 is a motor, and if any thyristor 142–148 has already failed when starter 150 attempts to start the motor, the motor will not rotate. Again, methods and systems consistent with this invention measure first instantaneous line current Ia, second instantaneous line current Ib, first instantaneous line voltage Vca, and second instantaneous line voltage Vbc. Voltages Vca, Vbc and currents Ia, Ib are measured, or sampled, by voltmeters 110, 111 and by ammeters 114, 116, respectfully, every 160 microseconds, or approximately 100 times per cycle. Methods and systems consistent with this invention then calculate instantaneous power P as P=Ia Vca+Ib Vbc. If any thyristor 142–148 failed prior to startup, the power supplied to the motor would have a small average value that accounts for motor losses.

Similar to the previous case, methods and systems consistent with this invention then determine peak power $P_{peak}$ and average power $P_{avg}$ during each cycle. A cycle is determined by the positive sloped zero crossings of voltage Vab as calculated by measurement taken from voltmeter 110 and voltmeter 111. Then, methods and systems consistent with this invention calculate a power ratio that equals $(P_{peak}-P_{avg})/P_{avg}$.

Table II shows the peak power $P_{peak}$, the average power $P_{avg}$, the difference between the peak power $P_{peak}$ and average power $P_{avg}$, and the power ratio when starter 150 attempts to start the motor and any thyristor 142–148 has previously failed open.

TABLE II

Thyristor Failure Before Motor Startup

| Time (s) | Peak Current (A) | Speed (rad/s) | $P_{peak}$ (kW) | $P_{avg}$ (kW) | $P_{peak}-P_{avg}$ (kW) | $(P_{peak}-P_{avg})/P_{avg}$ (%) |
|---|---|---|---|---|---|---|
| 0.60 | 199.00 | 0.00 | 23.00 | 2.50 | 20.50 | 820.00 |
| 0.80 | 863.00 | 0.00 | 198.00 | 17.00 | 181.00 | 1064.71 |
| 1.00 | 2675.00 | 0.00 | 823.00 | 98.00 | 725.00 | 739.80 |
| 1.20 | 2676.00 | 0.00 | 902.00 | 92.00 | 810.00 | 880.43 |
| 1.40 | 2676.00 | 0.00 | 903.00 | 92.00 | 811.00 | 881.52 |
| 1.60 | 2676.00 | 0.00 | 901.00 | 92.00 | 809.00 | 879.35 |

The data from Table II were obtained from simulating a 790 Hp motor, with one of the thyristors 142–148 failed open prior to starter 150 attempting to start the motor. In the simulation, the peak motor line current is limited to a predetermined value as if to control the motor inrush current. As discussed above, when starter 150 attempts to start the motor, the inrush current drawn by the motor can be excessive, typically six times the steady state current. Therefore, motor control systems often limit the current drawn to a predetermined value, which in this case is 0.45 LRA √(2), where LRA is the "locked rotor amps," i.e., the current drawn by the motor when the rotor is prevented from moving.

From Table II, the power ratio ranges from 739.8% to 1064.71% with one failed open thyristor of thyristors 142–148. On the other hand, when there is not a failed open thyristor and yet the current is limited via thyristors 142–148, the power ratios are significantly lower, as shown in Table III. Table III shows peak power $P_{peak}$, average power $P_{avg}$, the difference between peak power $P_{peak}$ and average power $P_{avg}$, and the power ratio during when starter 150 attempts to and successfully starts the motor and all thyristors 142–148 operate properly. The data from Table III were obtained from simulating a 790 Hp motor, with all thyristors 142–148 operating properly, with the peak line current limited to 0.45 LRA √(2). From Table III, the power ratio ranges from 207.5% to 440.63% during normal operation.

TABLE III

Motor Startup With No Thyristor Failure

| Time (s) | Peak Current (A) | Speed (rad/s) | $P_{peak}$ (kW) | $P_{avg}$ (kW) | $P_{peak}-P_{avg}$ (kW) | $(P_{peak}-P_{avg})/P_{avg}$ (%) |
|---|---|---|---|---|---|---|
| 0.60 | 200.00 | 0.00 | 17.30 | 3.20 | 14.10 | 440.63 |
| 0.80 | 870.00 | 0.00 | 141.00 | 27.00 | 114.00 | 422.22 |
| 1.00 | 2664.00 | 1.80 | 621.00 | 186.00 | 435.00 | 233.87 |
| 2.00 | 2665.00 | 23.30 | 619.00 | 199.00 | 420.00 | 211.06 |
| 3.00 | 2665.00 | 46.00 | 617.00 | 200.00 | 417.00 | 208.50 |
| 4.00 | 2665.00 | 70.30 | 615.00 | 200.00 | 415.00 | 207.50 |
| 5.00 | 2665.00 | 96.70 | 616.00 | 198.00 | 418.00 | 211.11 |

Thus, caution is necessary because even during successful startup, i.e., when all thyristors 142–148 are switching properly, and inrush current is controlled, the power ratio is significantly larger than zero. This large ratio is due to the non-sinusoidal motor currents, as a result of the non-zero firing angle associated with starting the motor. When starter 150 attempts to start the motor, methods and systems consistent with this invention detect a failed open thyristor when the power ratio exceed a second predetermined threshold. In this simulated example, a second predetermined threshold of 600% would be sufficient to detect a failed open thyristor, which is different than first predetermined threshold when operating at full speed.

Figure 3:
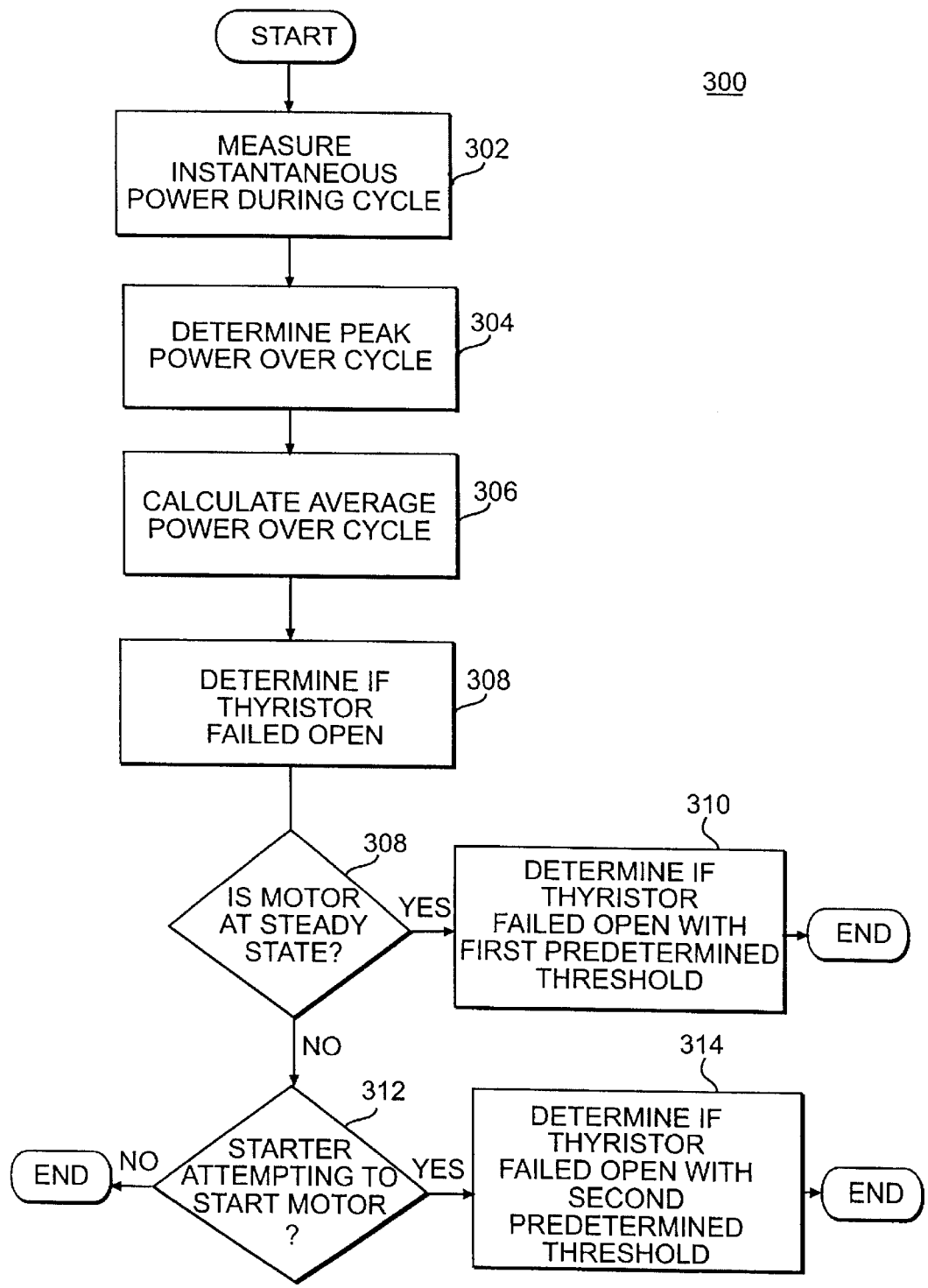
FIG. 3 is a flowchart of a process for detecting if a thyristor failed open in a solid-state motor starter.

FIG. 3 is a flowchart of a process for detecting if any thyristor 142–148 failed open in solid-state starter 150. First, methods and systems consistent with this invention measure an instantaneous power delivered to load 102 during a cycle of the input (step 302). Then, methods and systems consistent with this invention determine the peak power (step 304) and calculate the average power (step 306) delivered to load 102 over the cycle. Then, methods and systems consistent with this invention determine if the motor is operating at steady state speed (step 308). If the motor is operating at steady state speed, methods and systems consistent with this invention determine if any thyristor 142–148 failed open with first predetermined threshold (step 310). If the motor is not operating at steady state speed, methods and systems consistent with this invention determine if the motor is starting, or accelerating (step 312). If starter 150 is attempting to start the motor, methods and systems consistent with this invention determine if any thyristor 142–148 failed open with second predetermined threshold (step 314).

Figure 4:
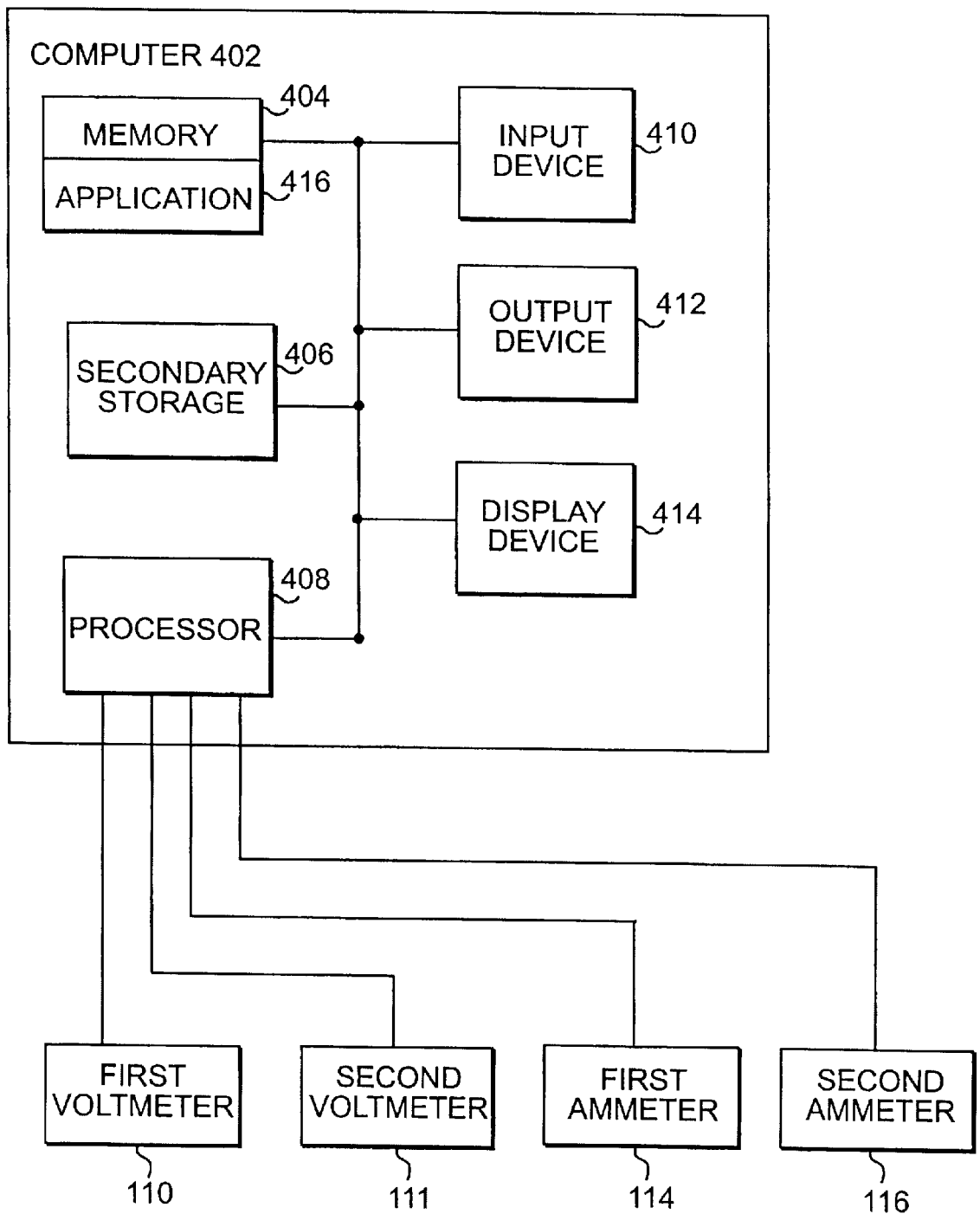
FIG. 4 depicts a data processing system suitable for use with methods and systems consistent with this invention.

FIG. 4 depicts a data processing system suitable for use with methods and systems consistent with this invention. Computer 402 includes a memory 404, a secondary storage device 406, a processor 408 such as a central processing unit (CPU) or a micro-processor, an input device 410, a display device 414, and an output device 412. Input device 410 may be a keyboard, a mouse, or both. Display device 414 may be a cathode ray tube (CRT) that can display a graphical user interface. Memory 414 and secondary storage 416 may store application programs and data for execution and use by processor 408. In particular, memory 404 stores an application 416 used to implement process 300. Processor 408 is connected to first voltmeter 110, second voltmeter 111, first ammeter 114, and second ammeter 116. Thus, processor 408 may input instantaneous voltage Vca, instantaneous voltage Vbc, instantaneous current Ia, and instantaneous current Ib.

Those skilled in the art recognize that various modifications and variations can be made in the preceding examples without departing from the scope or spirit of the invention. For example, even though the most commonly used controlled rectifier is the thyristor, any type of controlled rectifiers would suffice. Also, although two ammeters and voltmeters are used above, it is possible to use more than two ammeters and voltmeters, or only one. Further, it is possible that the load is other than a motor; methods and systems consistent with this invention work with any type of load. When the load is not a motor, the solid-state starter may be Another method and apparatus for detecting a failed thyristor is disclosed in a United States patent application entitled "Method and Apparatus for Detecting a Failed Thyristor," application Ser. No. 09/373,500, filed Aug. 13, 1999, assigned to the same assignee as this application, which is hereby incorporated by reference. A method and apparatus for triggering, or driving a thyristor or a solid state switch, is disclosed in a United States patent application entitled "Highly Efficient Driver Circuit for a Solid State Switch," application Ser. No. 09/373,502, filed Aug. 13, 1999, assigned to the same assignee as this application, which is hereby incorporated by reference.

The description of the invention does not limit the invention. Instead, it provides examples and explanations to allow persons of ordinary skill to appreciate different ways to practice the invention. The following claims define the true scope and spirit of the invention.

What is claimed is:

1. A method of detecting if a thyristor failed open in a solid-state controller for delivering power to a load by an input, said method comprising:

measuring an instantaneous power delivered to the load during a cycle of the input;

determining a peak power delivered to the load over the cycle of the input;

calculating an average power delivered to the load over the cycle of the input; and determining if the thyristor failed open by comparing the magnitudes of the peak power and the average power.

2. The method of claim 1, wherein the step of determining if the thyristor failed open includes calculating a power difference by subtracting the average power from the peak power; and determining a power ratio by dividing the power difference by the average power.

3. The method of claim 2, including signaling a failed open thyristor thyristor condition when the power ratio exceeds a predetermined threshold.

4. The method of claim 2, including signaling a failed open thyristor condition when the power ratio exceeds a predetermined threshold when the controller is not reducing voltage applied to the load.

5. The method of claim 2, including signaling a failed open thyristor condition when the power ratio exceeds a predetermined threshold when the load is starting.

6. The method of claim 1, wherein measuring the instantaneous power includes summing a power in a first input to the load and a power in a second input to the load.

7. The method of claim 1, wherein the load is a motor and wherein measuring the instantaneous power includes measuring the instantaneous power of the motor.

8. An apparatus of detecting if a thyristor failed open in a solid-state controller for delivering power to a load by an input, said method comprising:

means for measuring an instantaneous power delivered to the load during a cycle of the input;

means for determining a peak power delivered to the load over the cycle of the input;

means for calculating an average power delivered to the load over the cycle of the input; and means for determining if the thyristor failed open by comparing the magnitudes of the peak power and the average power.

9. The apparatus of claim 8, wherein the step of determining if the thyristor failed open includes means for calculating a power difference by subtracting the average power from the peak power; and determining a power ratio by dividing the power difference by the average power.

10. The apparatus of claim 9, including means for signaling a failed open thyristor thyristor condition when the power ratio exceeds a predetermined threshold.

11. The apparatus of claim 9, including means for signaling a failed open thyristor condition when the power ratio exceeds a predetermined threshold when the controller is not reducing voltage applied to the load.

12. The apparatus of claim 9, including means for signaling a failed open thyristor condition when the power ratio exceeds a predetermined threshold when the load is starting.

13. The apparatus of claim 8, wherein the means for measuring the instantaneous power includes means for summing a power in a first input to the load and a power in a second input to the load.

14. The apparatus of claim 8, wherein the load is a motor.

15. An apparatus for detecting if a thyristor failed open in a solid-state controller for delivering power to a load by an input, said apparatus comprising:

a power meter for measuring an instantaneous power delivered to the load during a cycle of the input;

a memory containing a program configured to determine a peak power delivered to the load over the cycle of the input, calculate an average power delivered to the load over the cycle of the input, and determine if the thyristor failed open by comparing the magnitudes of the peak power and the average power; and a processor for running the program.

16. The apparatus of claim 15, wherein the program is further configured to determine if the thyristor failed open by calculating a power difference by subtracting the average power from the peak power; and determine a power ratio by dividing the power difference by the average power.

17. The apparatus of claim 16, wherein the program is further configured to signal a failed open thyristor thyristor condition when the power ratio exceeds a predetermined threshold.

18. The apparatus of claim 16, wherein the program is further configured to signal a failed open thyristor condition when the power ratio exceeds a predetermined threshold when the controller is not reducing voltage applied to the load.

19. The method of claim 16, wherein the program is further configured to signal a failed open thyristor condition when the power ratio exceeds a predetermined threshold when the load is starting.

20. The method of claim 15, wherein the power meter measures the instantaneous power as a sum of a power in a first input to the load and a power in a second input to the load.

21. The method of claim 15, wherein the load is a motor.

* * * * *

UNITED STATES PATENT AND TRADEMARK OFFICE
CERTIFICATE OF CORRECTION

PATENT NO.    : 6,404,346 B1
DATED         : June 11, 2002
INVENTOR(S)   : Ivan Jadrić and Harold R. Schnetzka It is certified that error appears in the above-identified patent and that said Letters Patent is hereby corrected as shown below:

Column 8,
Line 44, after "open thyristor", delete "thyristor" (second occurrence).

Column 9,
Line 13, after "open thyristor", delete "thyristor" (second occurrence).

Column 10,
Line 16, after "open thyristor", delete "thyristor" (second occurrence).

Signed and Sealed this

First Day of April, 2003

JAMES E. ROGAN
*Director of the United States Patent and Trademark Office*